(12) United States Patent
Kasper et al.

(10) Patent No.: US 9,903,539 B2
(45) Date of Patent: Feb. 27, 2018

(54) CIRCUIT BOARD ELEMENT HAVING AT LEAST ONE LED

(75) Inventors: Alexander Kasper, Graz (AT); Gregor Langer, Wölfnitz (AT)

(73) Assignee: AT & S AUSTRIA TECHNOLOGIE & SYSTEMTECHNIK AKTIENGESELLSCHAFT, Leoben-Hintererg (AT)

( * ) Notice: Subject to any disclaimer, the term of this patent is extended or adjusted under 35 U.S.C. 154(b) by 659 days.

(21) Appl. No.: 14/009,129

(22) PCT Filed: Mar. 20, 2012

(86) PCT No.: PCT/AT2012/000070
§ 371 (c)(1),
(2), (4) Date: Oct. 1, 2013

(87) PCT Pub. No.: WO2012/129580
PCT Pub. Date: Oct. 4, 2012

(65) Prior Publication Data
US 2014/0233241 A1    Aug. 21, 2014

(30) Foreign Application Priority Data
Apr. 1, 2011    (AT) ................ GM183/2011

(51) Int. Cl.
*G02B 6/42* (2006.01)
*F21K 99/00* (2016.01)
(Continued)

(52) U.S. Cl.
CPC ................ *F21K 9/50* (2013.01); *F21K 9/60* (2016.08); *F21V 7/22* (2013.01); *G02B 6/4286* (2013.01);
(Continued)

(58) Field of Classification Search
CPC .. F21K 9/50; F21K 9/54; H05K 1/181; H05K 1/185; H05K 1/0274
See application file for complete search history.

(56) References Cited

U.S. PATENT DOCUMENTS 4,637,681 A * 1/1987 Yamamoto et al. ............ 385/14
5,015,059 A    5/1991 Booth et al.
(Continued)

FOREIGN PATENT DOCUMENTS

DE    10 2009 019412 A1    11/2010
EP    1 950 587 A2    7/2008
(Continued)

OTHER PUBLICATIONS

Machine translation of JP 8-264748.*

*Primary Examiner* — Robert May
*Assistant Examiner* — Leah S Macchiarolo
(74) *Attorney, Agent, or Firm* — Ladas & Parry LLP

(57) ABSTRACT

The invention relates to a circuit board element (1) comprising a substrate (2), on which at least one dielectric layer (7) is arranged, and at least one LED (light-emitting diode) (10), wherein at least one channel-shaped waveguide cavity (11) leading away from the LED (10) is provided in the dielectric layer (7), which waveguide cavity leads to at least one integrated light-sensitive component (12), preferably a photo-diode or photocell, arranged for examining the light emission, wherein the LED (10) is preferably also arranged in a cavity (9) that is connected to the waveguide cavity (11). The invention further relates to a method for producing such a circuit board element (1).

29 Claims, 8 Drawing Sheets

(51) Int. Cl.
  *H05K 1/18*    (2006.01)
  *F21V 7/22*    (2018.01)
  *H05K 3/30*    (2006.01)
  *F21K 9/60*    (2016.01)
  *H05K 1/02*    (2006.01)

(52) U.S. Cl.
  CPC ........... *H05K 1/0274* (2013.01); *H05K 1/181* (2013.01); *H05K 3/30* (2013.01); *G02B 6/428* (2013.01); *H05K 1/0203* (2013.01); *H05K 2201/10106* (2013.01); *H05K 2201/10121* (2013.01); *Y02P 70/611* (2015.11); *Y10T 29/4913* (2015.01)

(56) References Cited

U.S. PATENT DOCUMENTS

| | | | |
|---|---|---|---|
| 5,987,202 A * | 11/1999 | Gruenwald et al. | 385/49 |
| 6,807,218 B1 * | 10/2004 | Greenwood et al. | 372/107 |
| 7,248,768 B2 * | 7/2007 | Jeon et al. | 385/47 |
| 8,723,102 B2 * | 5/2014 | Unterborsch et al. | 250/227.11 |
| 2002/0085785 A1 | 7/2002 | Kishimoto et al. | |
| 2009/0225565 A1 | 9/2009 | Zimmermann et al. | |
| 2011/0043724 A1 | 2/2011 | Kim | |

FOREIGN PATENT DOCUMENTS

| | | |
|---|---|---|
| JP | 7 234345 A | 9/1995 |
| JP | 8 264748 A | 10/1996 |
| JP | 2002-258084 A | 9/2002 |
| WO | 2004/010191 A1 | 1/2004 |

* cited by examiner

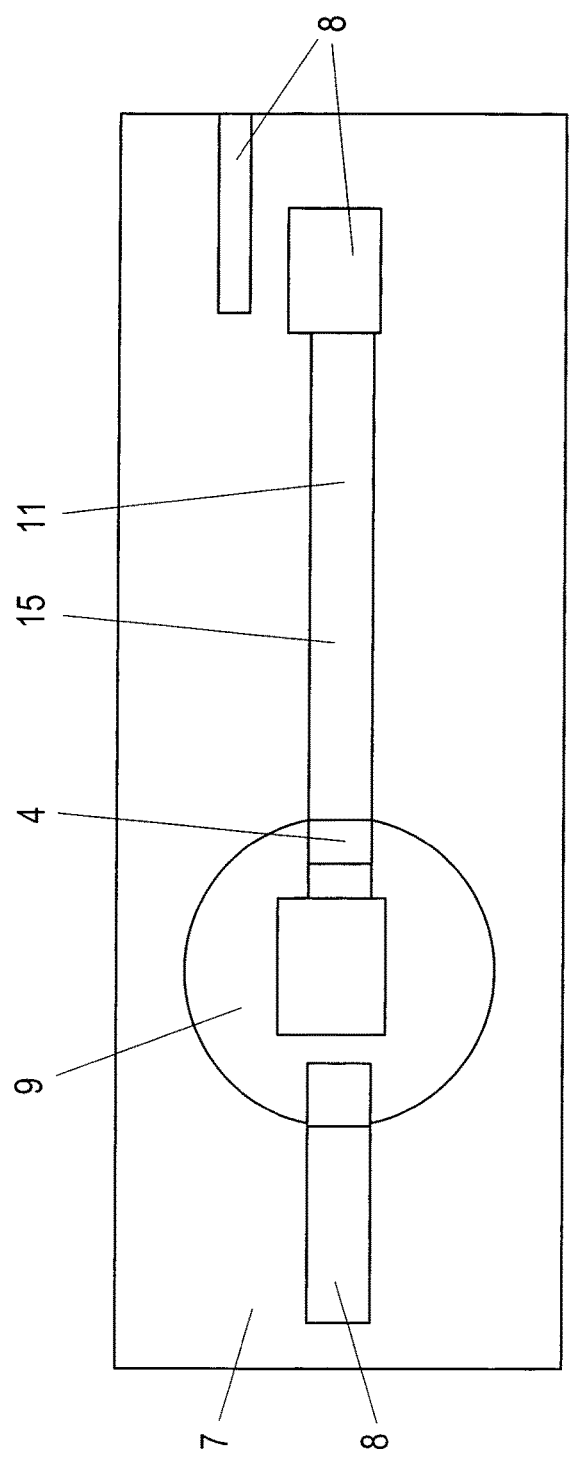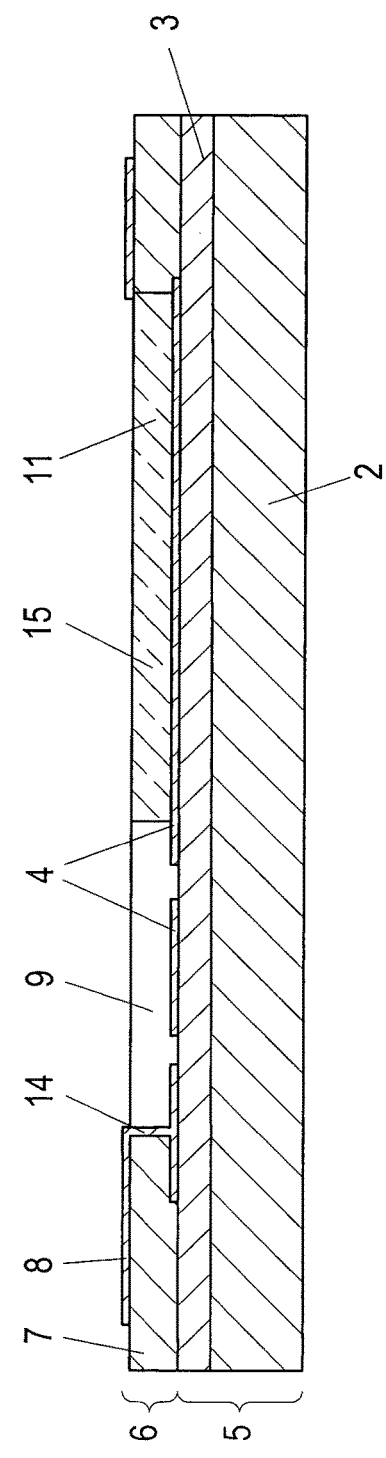

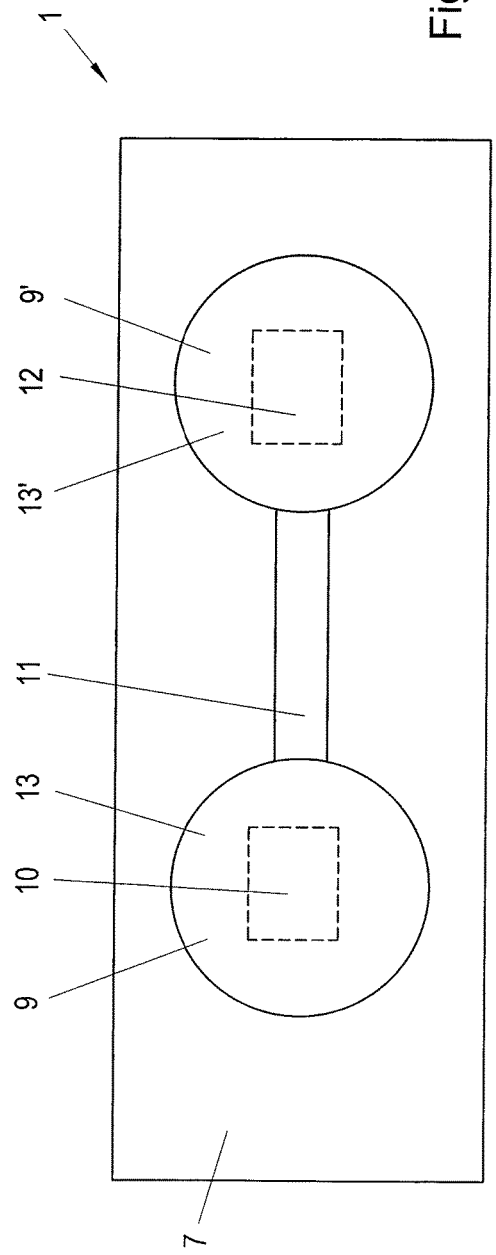

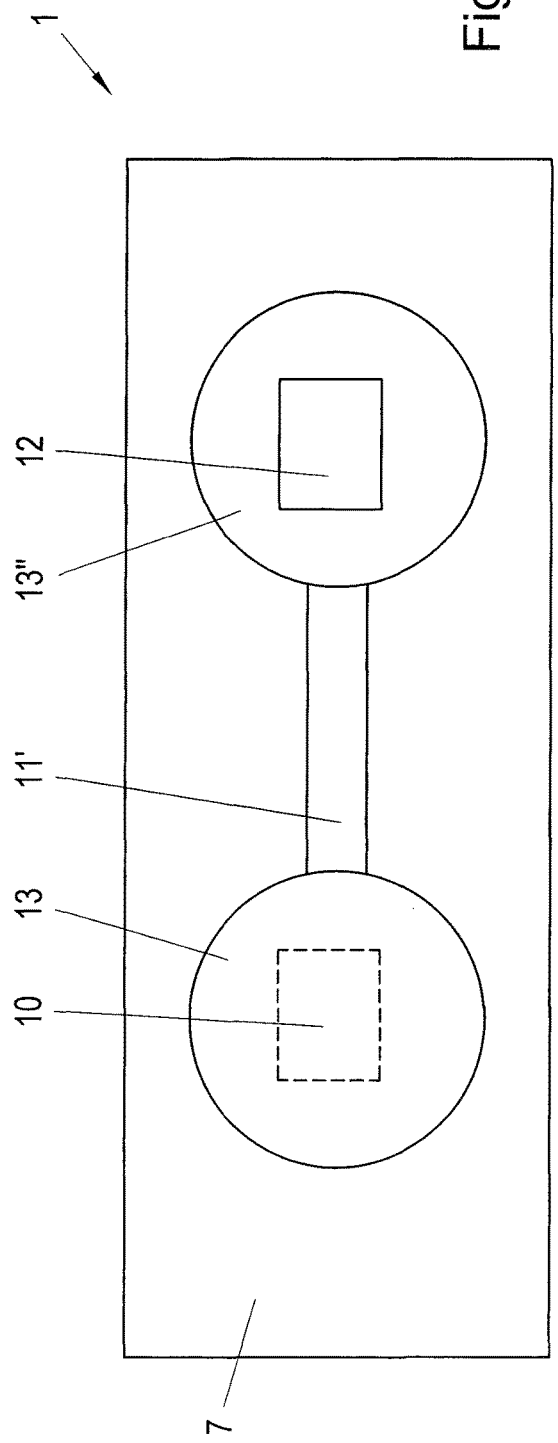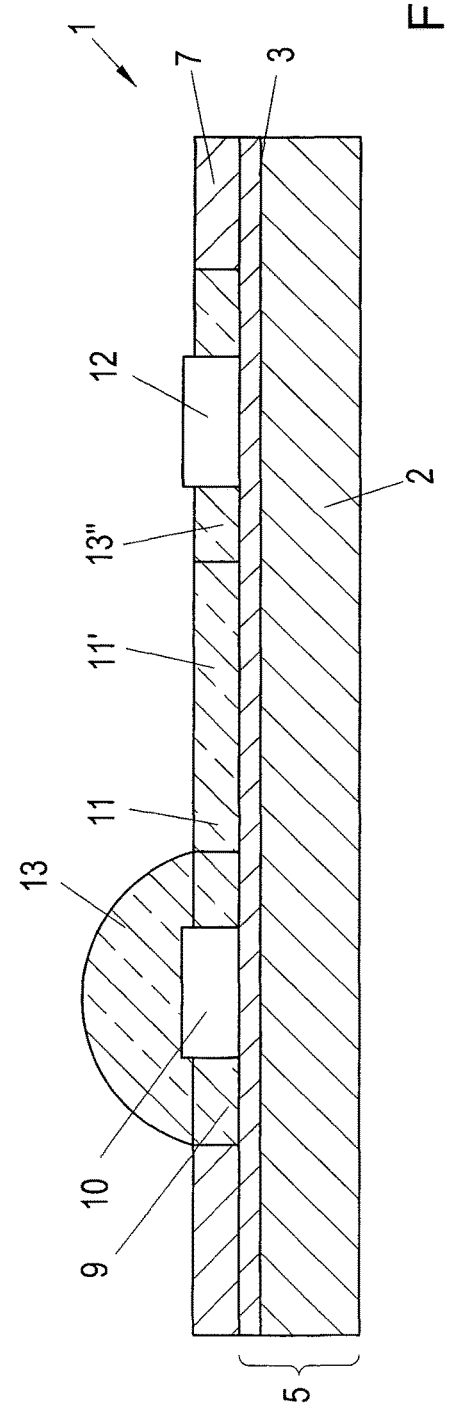

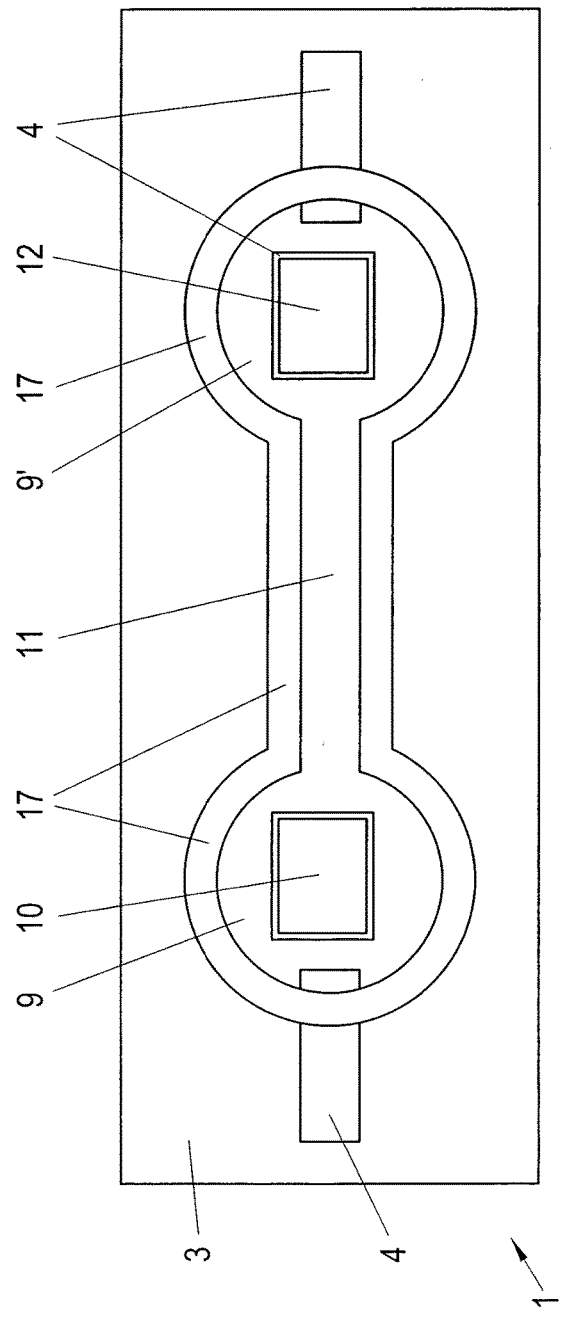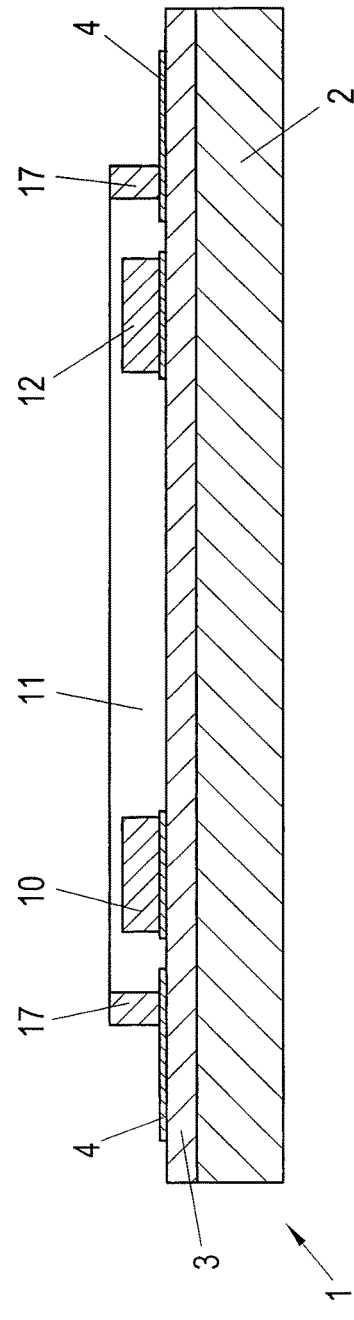

CIRCUIT BOARD ELEMENT HAVING AT LEAST ONE LED

RELATED APPLICATION INFORMATION

This application is a 371 of International Application PCT/AT2012/000070 filed 20 Mar. 2012 entitled "Circuit Board Element Having At Least One Led", which was published on 4 Oct. 2012, with International Publication Number WO 2012/129580 A2, and which claims priority from Austria Patent Application GM 183/2011 filed 1 Apr. 2011, the content of which is incorporated herein by reference.

The invention relates to a circuit board element comprising a substrate on which at least one dielectric layer is arranged, and at least one LED (light-emitting diode).

The invention further relates to a method for producing such a circuit board element.

Not least with a view to the restrictions in manufacturing and using bulbs for reasons of economic policy and environmental policy have illumination systems comprising light-emitting diodes, briefly LEDs, become increasingly interesting. It is also important that, due to the technical further development in LED technology, LEDs actually are no longer only significant as display elements in devices, but are becoming increasingly interesting also for other applications such as for TV flat screens, but also in lighting systems. Modern LEDs do not only have sufficient brightness, but are also low priced with respect to their manufacturing costs, and are meanwhile used on a large scale, for instance in lighting systems in motor vehicles.

Usually, LEDs emit a particular color (that means with a particular wavelength, with a more or less narrow bandwidth), and by mixing the most varying colors up to white light, and here again a cold white light or a warm white light, may be achieved. The corresponding technologies are sufficiently known and need not be explained any further. Just as an example it is mentioned that white light may be obtained with a red, a green, and a blue LED with an appropriate driving and hence mixing. For driving, pulse width modulation (PWM) is preferably used, by means of which the current through the LEDs is modulated. The longer the current pulses are, the brighter the LEDs shine. When mixing LEDs of different colors, these LEDs also have to be driven differently to achieve the desired mixed color. This mixing ratio, however, changes during the lifetime of the LEDs, so that the mixed color changes, which finally leads to an undesired result. A change of color may further also be caused by different environmental temperatures, for instance, in the case of comparatively high temperatures.

It is therefore already state of the art to permanently monitor light produced by LEDs by means of sensors and to readjust the LED currents as a function of the changes in the respective light color and also of the temperatures. Reference may be made in this context to EP 2 082 620 B1, for instance.

A disadvantage with the known solutions, in which the light emitted, for instance, white LED light, which is emitted in the combination of red, green, and blue LEDs, is detected by means of a sensor so as to supply an actual electric signal to the control unit, is that these circuits including the sensor are provided in a separate device, wherein such a monitoring or control circuit, respectively, cannot readily be used for all applications, e.g. with miniaturized circuits with LEDs. Such LED units would have to be measured at time intervals in laboratories or the like, so that a continuous readjustment of the LED light is not possible.

It is therefore an object of the invention to provide a remedy and to enable, in a simple and cost-efficient manner, a detection of the LED light emitted—irrespective of the color, whether mixed light (white light) of RGB LEDs (RGB—Red Green Blue), or else of single LEDs—directly at the place of the LEDs in order to then evaluate the measurement result immediately by a monitoring or control circuit, respectively, and to enable a readjustment of the current supply of the LEDs, preferably by PWM. Thus, an integrated system is to be provided to enable this monitoring with readjustment.

For solution of this object the invention provides a circuit board element as defined in claim 1. Advantageous embodiments and further developments as well as advantageous methods for producing such a circuit board element are stated in the dependent claims.

With the instant circuit board element, a channel-shaped waveguide cavity thus exists in the dielectric layer, which leads away from the LED to an integrated light-sensitive component that is arranged for monitoring the light emission and that is part of a monitoring or control circuit, respectively. This component is preferably formed by a photodiode or a photo transistor or a similar photo sensor. It will be appreciated that, in the case of several LEDs, several photo-sensitive detector elements will have to be provided correspondingly, which may possibly also be formed by a single multiple detector with several receiving areas. In operation, the LEDs supply light to these photo-sensitive components in a kind of "bypass" via the optical waveguide in the waveguide cavity, so that it is possible to detect the respective LED light directly on the spot, within the circuit board element itself, as regards brightness and color, etc. The measurement values detected may, preferably after digitalization, be compared to target values that may be stored in a control chip, so that, in the case of deviations, a readjustment of the current drive for the LEDs may be performed. The electronic components that are necessary for the control may be formed in a per se conventional manner and may, above all, also be arranged directly on the same circuit board element in conventional technology, so that an integrated correction of colors and brightnesses of LEDs may be performed advantageously directly at the circuit board element.

Preferably, the respective LED or a LED chip, respectively, is accommodated in a cavity in the dielectric layer material, wherein the waveguide cavity directly follows the LED cavity. For forming the optical waveguide, the waveguide cavity is in particular filled with an optical material that is introduced in the wet condition.

The present technology enables a further miniaturization since the optical waveguide connection between the LED and the photo-sensitive component (photodiode) allows a very close contiguous arrangement of these components. The integration of the LED component, on the one hand, and of the sensor system or control circuit, respectively, on the other hand, in one and the same circuit board element enables even with miniaturized applications, with restricted space available, continuous examination and readjustment of the LED light. The cavities for the optical waveguide and preferably also for the LED and further, as is also preferred, for the light-sensitive component, that means in particular the photodiode, enable also the utilization of light reflection. Another advantage results from the fact that encapsulations that are relatively small in dimension, such as they are provided for protection of the components, are also possible. Furthermore, the possibilities of design are increased.

As far as the addressed light reflection is concerned, it is of advantage if the upper side of the waveguide, i.e. the upper side of the optical material, is covered with a reflective layer, e.g. with solder resist.

It is further favorable if, for increasing reflectivity, for generating electrical connections and/or for producing roundings or the like, the walls of the waveguide cavity are coated with a metal, e.g. with copper or gold, possibly with solder resist.

For particular reflection effects it is also advantageous if the walls of the waveguide cavity and/or possibly the LED cavity are designed to be inclined.

As mentioned, in a favorable embodiment it is provided that the light-sensitive component is arranged in a cavity of the dielectric layer. As an alternative, it is also favorable if the light-sensitive component is arranged on the layer comprising the waveguide cavity, wherein the waveguide cavity then extends to reach underneath this component.

In order to dissipate heat from the arrangement, it may also be provided advantageously that the layer comprising the waveguide cavity is arranged on a heat dissipation layer, e.g. of aluminum. It is further possible that the substrate consists of heat-dissipating material, e.g. of aluminum.

An embodiment of the circuit board element which is favorable with respect to manufacturing technology is further characterized by the fact that the waveguide cavity is confined by a frame printed on the substrate or a dielectric layer, respectively.

For manufacturing a circuit board element as stated above, the preferred process may be that, on a ready-processed substrate, possibly a heat-dissipating plate, a circuit board layer that has been pre-fabricated by the forming of an elongate cavity opening for the production of a channel-shaped waveguide, e.g. a prepreg, is applied, and then the waveguide and possibly the LED and/or the light-sensitive component are arranged in the opening.

On the other hand, for producing such a circuit board element it is often also favorable if a dielectric layer is arranged on the substrate in which dielectric layer, e.g. by laser structuring and removing of defined regions, or by imprinting, for instance, by means of block stamp printing, a cavity is applied at least for the channel-shaped waveguide.

It is further also of advantage for an easy production if a frame of a dielectric surrounding a cavity is printed on the substrate, e.g. by screen printing, ink printing, stencil printing or a similar printing method.

In the afore-mentioned cases the waveguide cavity may be filled with an optical material (in the wet condition), for instance, by screen printing, by spreading by doctor blade, by ink jet printing, or a similar technology.

Preferably, the upper side of the waveguide may be covered with a reflective layer. In a simple embodiment, solder resist, which may at the same time also be used for other purposes during the production of the circuit board element, is used for the reflective layer.

It is further favorable if the walls of the waveguide cavity are coated, for instance with solder resist, to increase reflectivity.

As mentioned, the light-sensitive component, i.e. preferably a photodiode or a photocell, may be arranged in a cavity in the dielectric layer or else on the dielectric layer. In the latter case, the light-sensitive component partially covers the waveguide cavity.

It should be mentioned that photoelectric structures or circuit board elements with waveguides are widely known, cf. e.g. JP 2005-195991, AT 413 891 B, AT 505 834 B, AT 503 027 B, or US 2009/074354 A1. However, they do not comprise any monitoring structures, in particular not those with cavities in a dielectric layer.

The invention will be explained in detail in the following by means of preferred embodiments illustrated in the drawings on which, however, the invention is not intended to be restricted.

The drawings show in detail:

FIGS. 1 and 2 a circuit board element (or the part of it that is essential here) according to the invention in a schematic top view (FIG. 1) and in a schematic sectional view (FIG. 2);

FIGS. 3 to 9 different stages during the production of a circuit board element pursuant to FIGS. 1 and 2, wherein FIGS. 3 and 4 illustrate prefabricated individual elements in a separated condition in top view and in section;

FIGS. 7 and 8 illustrate an intermediate product of the circuit board element, still without components, in top view and in section;

FIGS. 10 and 11 illustrate a modified embodiment of the circuit board element according to the invention in schematic top view (FIG. 10) and in schematic section (FIG. 11);

FIGS. 12 and 13 show in corresponding illustrations, namely in top view (FIG. 12) and in section (FIG. 13) another variant of the instant circuit board element; and FIGS. 14 and 15 show, also in corresponding illustrations (top view and section), another embodiment of the circuit board element according to the invention.

Figure 1:
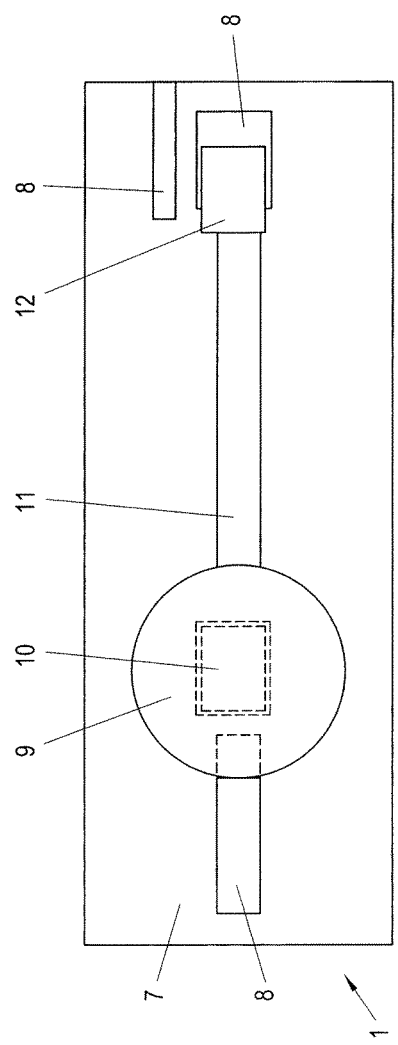

Throughout the drawings, the respective printed circuit board element (or the part of it that is of interest here) is designated with 1. As results from FIGS. 1 and 2, in the instant circuit board element 1, on a substrate 2 that may be a conventional circuit board substrate or possibly, for the purpose of heat dissipation, an aluminum substrate, an isolating or dielectric layer 3 is provided, and thereabove, in the illustrated embodiment, a first conductor layer 4, e.g. of copper, which, according to FIGS. 1 and 2, has already been structured.

On this circuit board part 5, for instance, a further circuit board part 6, without substrate, namely with a dielectric layer 7 and a conductor layer 8, is arranged. Here, too, the conductor layer 8 has already been structured.

The dielectric layer 7 comprises a cavity 9 which is, for instance, circular in top view, for accommodating at least one LED or at least one LED chip 10, respectively. A channel-shaped optical waveguide cavity 11 extending to reach beneath a photosensitive optoelectronic component 12, e.g. in the form of a photodiode or a photo transistor, in general a sensor, joins this cavity 9.

In the cavity 11, a waveguide material is present, and the waveguide 11' formed this way may, for instance, lead up to the LED chip 10, but it is also sufficient to guide the waveguide 11' narrow to the LED chip 10 and to let it terminate there at a distance thereof.

Figure 2:
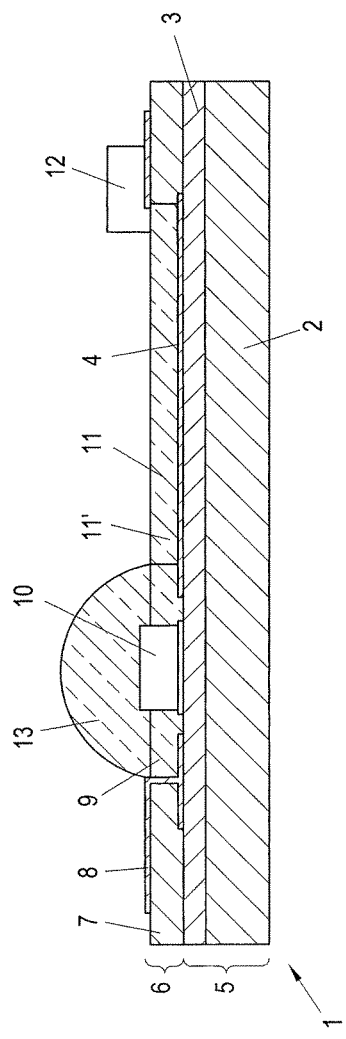

As many be seen from FIG. 2, the photodiode 12 is mounted on the upper conductor layer 8 in the illustrated example, whereas the LED chip 10 is mounted on the lower conductor layer 4.

The LED 10 is encapsulated in a resin drop 13 (an encapsulation per se known as "glob top" in the state of the art). Such glob tops are, for instance, provided for a mechanical protection for LED chips and bonding wire connections, but also in view of the lens effect (light guidance) and/or as a matrix for particles (e.g. phosphor) for adjusting the color of the light, for example for white light applications.

The direction of radiation of the LED 10 is, for instance, substantially perpendicular to the main plane of the circuit board element 1, but a light portion of the LED 10 also arrives at the light-sensitive component 12 via the optical waveguide 11' in the cavity 11 which extends at an angle to this main direction of radiation (in the following, a photodiode 12 is always referred to in this context for reasons of simplification, but it should be clear that other photosensitive sensor elements or components are also possible).

The photodiode 12 is now part of a monitoring or control circuit, respectively, which is not illustrated in the following, but may be accommodated on the circuit board element 1 with its components in a per se conventional manner.

If the light emission of the LED 10 changes its character in the course of time, for instance, the color shifts from white in the direction of red, green, or blue, if one assumes that the white light is composed of red, green, and blue light and/or three such single LEDs for red, green, and blue are arranged at the LED chip 10, this shift in the optical area is detected by means of the photo sensor 12 or the photo sensors, respectively, wherein a corresponding electronic signal is obtained which is supplied to a per se known control circuit for adjusting a triggering or driver stage for the LED 10. An undesired change of the light emission may incidentally also result from the fact that the resin material of the encapsulation 13 changes in the course of time (e.g. reduction of transmission).

As mentioned, the further components of this monitoring and control circuit may be arranged in conventional circuit board technology, which is therefore not illustrated in detail in the drawings for the sake of simplification. Likewise, the conductive pattern (e.g. 4, 8) of the circuit board substrates has been indicated partially only or has been omitted at all throughout the Figures of the drawings. Furthermore, further steps and/or layers, such as further circuit board layers and/or protective layers and/or cover layers, etc. have also been omitted in the drawings for the sake of simplification.

Figure 3:
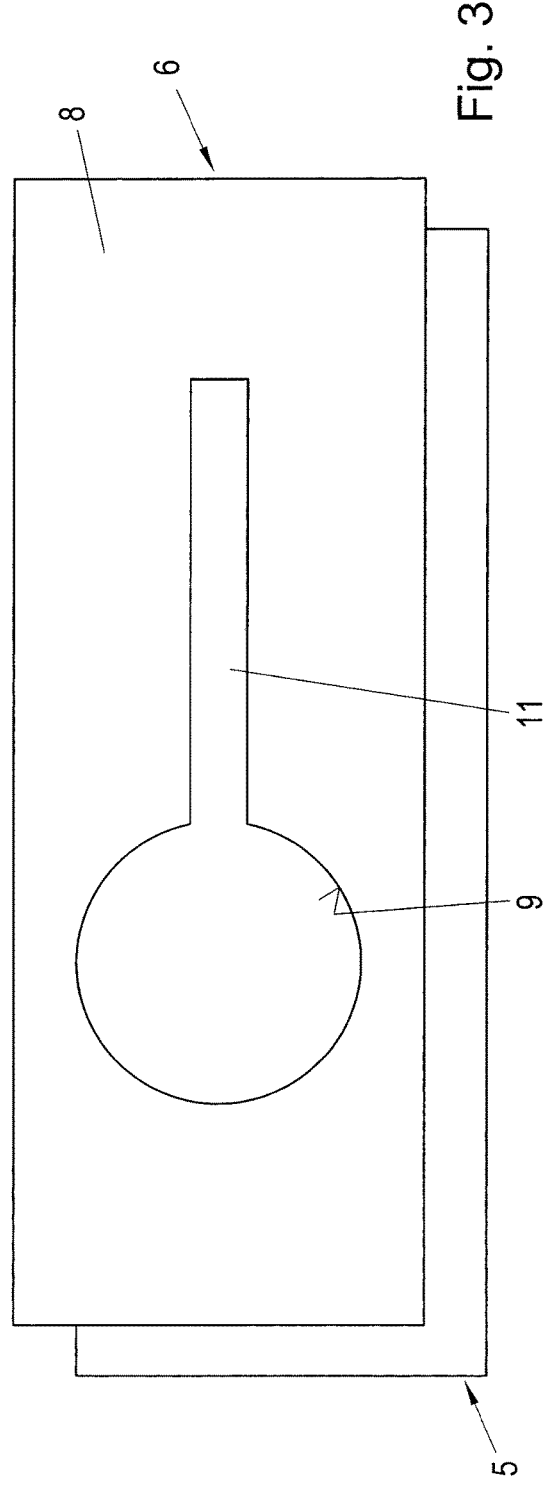
Figure 4:
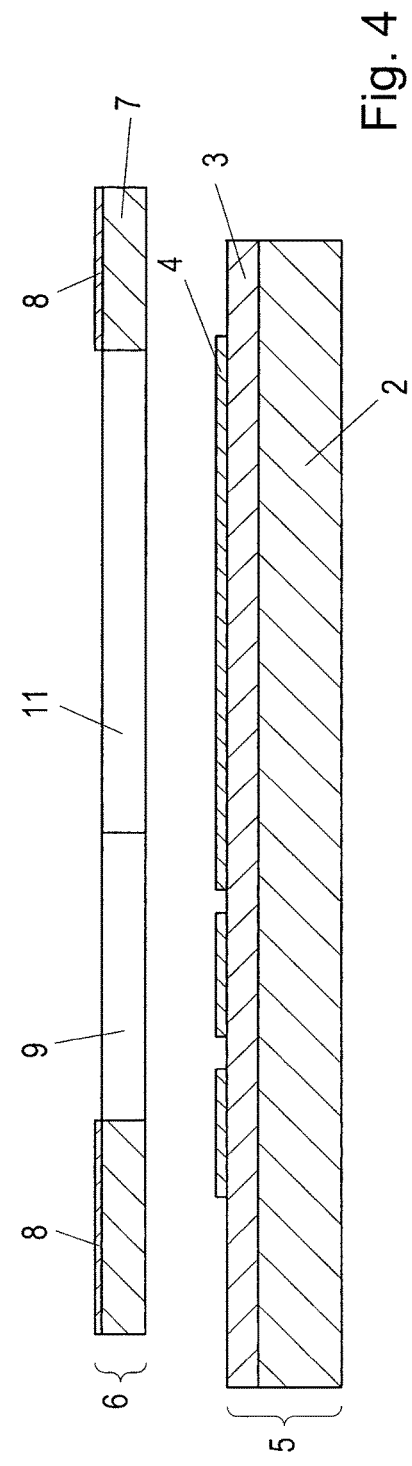

For the production of a circuit board element as illustrated in FIGS. 1 and 2, for instance, a pre-fabricated upper circuit board "part" 6, such as a prepreg (in accordance with the illustration)—cf. FIGS. 3 and 4—, or else a core or a ready-processed circuit board, is mounted on the lower circuit board "part" 5 by pressing and/or gluing. The circuit board "part" 5 may be a ready-processed FR4 circuit board element, IMS, etc., but also a heat-dissipating plate.

The upper circuit board part 6 that is to be pressed or to be glued has been pre-fabricated, for instance by laser cutting, by punching or similar technologies, such that at least the cavity 11 for the optical waveguide 11' (see FIG. 2) has been provided. Preferably, the component cavity 9 for the LED 10 is provided in addition to the waveguide cavity 11 that follows the component cavity 9 (cf. FIG. 3).

Figure 5:
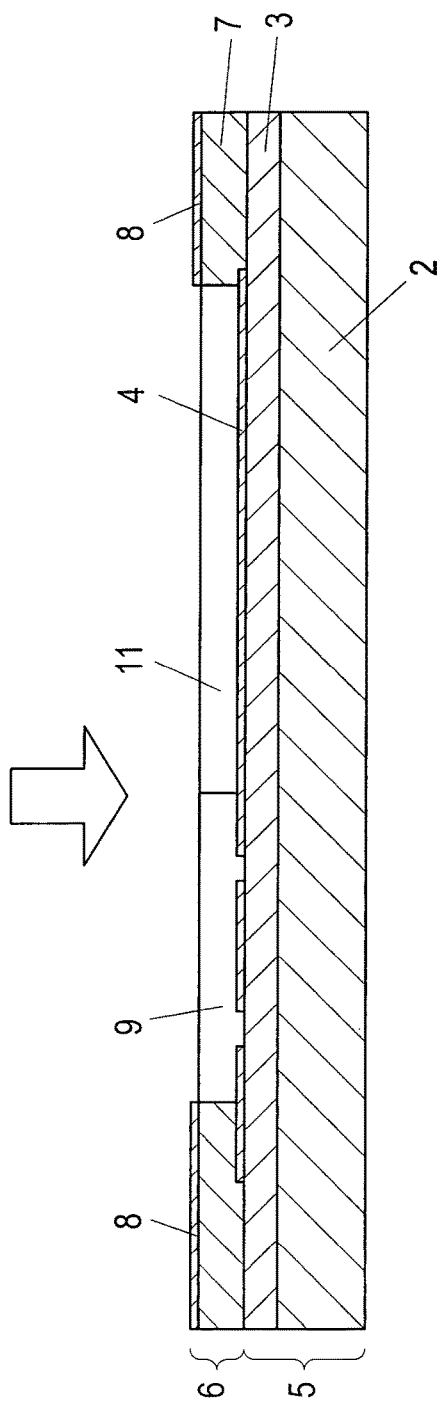
FIGS. 5 and 6 illustrate the following steps during the uniting of the individual elements and the application of standard circuit board processes in section; further
Figure 6:
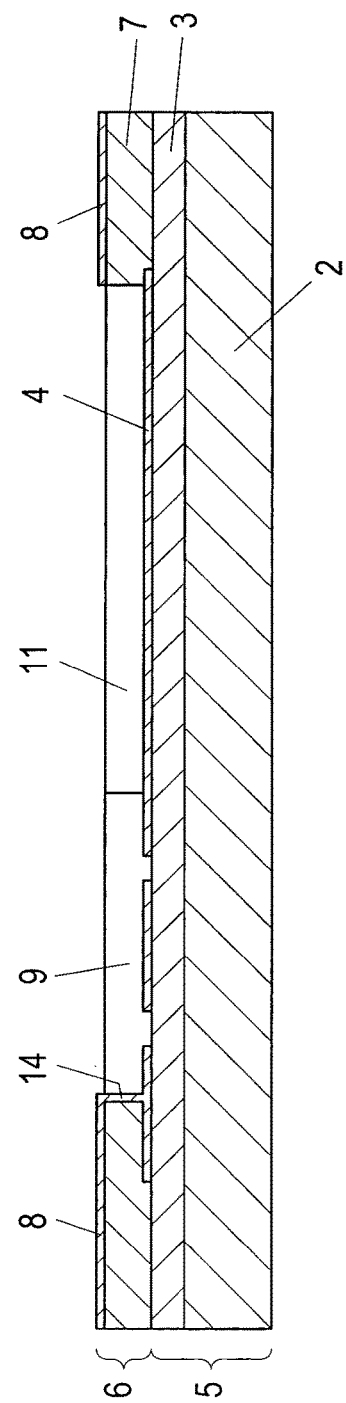

In accordance with FIG. 5, the circuit board parts 6 and 5 are now pressed or glued to one another. Subsequently, standard circuit board processes will follow, such as in particular the structuring of the conductor layer 8, cf. FIG. 6, wherein the layer 8 may also be connected with the layer 4, cf. the vertical plating 14 in FIG. 6. Furthermore, the walls of the cavities 9, 11 formed may be coated, and not only to establish an electrical connection (see the plating or connection 14 in FIG. 6), but also to increase reflectivity, and/or to introduce roundings, for example mirror elements. For these coatings of the walls of the cavities 9, 11, metals such as copper, gold, but also solder resist and similar materials may be used.

Subsequently, pursuant to FIGS. 7 and 8, an optical material 15 is filled in the waveguide cavity 11, for instance, by screen printing, by spreading by doctor blade, by ink jet methods, or similar technologies. The optical waveguide 11' formed this way with the optical material 15 may then, according to FIG. 9, be covered with a reflective layer 16, e.g. a solder resist, if desired.

Subsequently, the mounting of the LED chip 10 or of the photodiode 12, respectively, ensues in the instant embodiment, see FIGS. 1 and 2, and then the glob top encapsulation 13 is performed.

In the scope of the invention, different variations and modifications are possible. The conductor layer 8 may for example serve as a placement layer, and the conductor layer 4 may be used for the discharge of lost heat. The circuit board substrate 5, 6 may also comprise more than the two metal conductor layers 4, 8 illustrated.

Figure 9:
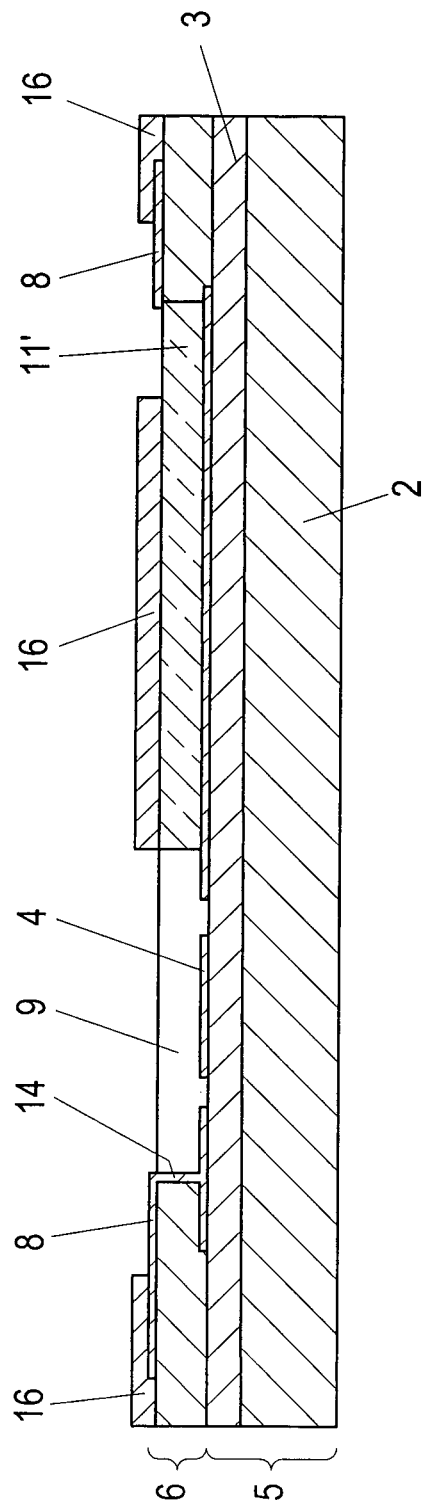
FIG. 9 illustrates a further intermediate step in section.

In modification of the sequence of the steps according to FIGS. 7 to 9 and the following mounting of the components (FIGS. 1 and 2), one may also proceed such that the waveguide material 15 is applied after the mounting of the components only. Moreover, it is also possible that the cavities 9, 11 are only produced after the applying of the circuit board part 6 on the circuit board part 5 positioned underneath. The cavity 9 in which the LED chip 10 is mounted need not necessarily form the confinement of the glob top encapsulation 13. This encapsulation 13 may rather also have a larger or a smaller diameter than the cavity 9. Furthermore, the cavity 9 may also be filled with solder resist after mounting of the LED and prior to the application of the glob top so as to increase reflectivity.

Moreover, the walls of the cavities 9, 11 may be designed to be inclined, for instance, by an appropriate drilling process in the case of the cavity 9, by a flowing of the prepreg (circuit board part 6) during pressing, and similar technologies.

It is further possible to apply a dielectric layer 7 on the substrate 2, and to subsequently apply the respective cavity 11 or 9, 9' in this dielectric layer afterwards, e.g. by laser structuring and removing of the corresponding regions, or else by imprinting, for instance, by means of block print.

The cavities 9, 11 may incidentally also be produced by a per se known technology as is, for instance, described in WO 2008/098271 A1. The waveguide material 15 may be a transparent polymer waveguide material that is introduced in the cavity 11 in the wet condition.

It will be appreciated that, if one LED 10 and one photodiode 12 are illustrated in the drawings, it is conceivable that a plurality of LEDs 10 and a plurality of photodiodes 12 (or multiple LEDs and/or multiple detector elements) may also be arranged on the circuit board element 1. Conventionally, plated through-holes (PTAs) or vias may also be provided, wherein the LED 10 and the photodiode 12 may also be arranged on opposing sides and not on the same side. For a multiple LED control, a corresponding number of waveguides 11' may also be provided.

Additional coatings may be produced in a wet process or by means of PVD or CVD processes (chemical or physical vapor deposition).

As may further be gathered from FIGS. 10 and 11, the LED chip 10 and the photodiode 12 may be mounted on the same conductor layer 4 (see FIG. 2). Furthermore, the photodiode 12 may also be provided with a glob top encapsulation 13'. To this end, an appropriate cavity 9' for the photodiode 12 and/or its encapsulation 13' has to be provided in the dielectric layer 7.

The optical waveguide 11' and the glob top 13 of the LED 10 or else, as may be gathered from FIGS. 12 and 13, the optical waveguide 11' and a modified encapsulation 13" of the photodiode 12 may consist of the same material and be applied in one single process step, for instance, by means of a dispenser, ink jet or capillary method.

FIG. 14 (top view) and 15 (schematic section) finally illustrate in general an embodiment of the instant circuit board element, wherein the cavities 11 and/or 9, 9° are formed by an upstanding, comparatively thin frame 17 being imprinted on the dielectric layer 3 arranged on the substrate 2. Suitable printing methods are, for instance, screen printing, ink printing, but also block print or similar printing technologies.

Moreover, FIGS. 14 and 15 again illustrate the conductor layer 4 that has already been structured, for instance, of copper. Furthermore, with the circuit board element 1 pursuant to FIGS. 14 and 15, a mounting with the components (LED 10, photo-diode 12) is preferably performed afterwards, after the imprinting of the frame 17.

With respect to FIGS. 14 and 15 it still may be mentioned that the optical layer, i.e. the optical material 15 (cf., for instance, FIG. 8) has not been illustrated so as to emphasize the frame 17. It will be appreciated that after the imprinting of the frame 17, i.e. after reaching the state illustrated in FIGS. 14 and 15, the realization of the waveguide 11' as described above will still have to be performed.

The invention claimed is:

1. A circuit board element comprising:
a substrate,
at least one LED (light-emitting diode) provided in a LED cavity, and
at least one channel-shaped waveguide cavity,
wherein at least one dielectric layer is arranged on the substrate and the LED cavity is arranged in the dielectric layer,
wherein the at least one channel-shaped waveguide cavity is provided in the dielectric layer and is filled with an optical material, and
wherein the at least one channel-shaped waveguide cavity directs light from the at least one LED to at least one integrated light-sensitive component which is arranged for checking the light emission of the LED, and is part of a control circuit for controlling the LED current.

2. The circuit board element according to claim 1, wherein the at least one integrated light-sensitive component is arranged in a cavity in the dielectric layer.

3. The circuit board element according to claim 1, wherein the upper side of the optical material in the at least one channel-shaped waveguide cavity is covered with a reflective layer.

4. The circuit board element according to claim 3, wherein the reflective layer is a solder resist.

5. The circuit board element according to claim 1, wherein the walls of the at least one channel-shaped waveguide cavity-and/or and the LED cavity are coated with a metal.

6. The circuit board element according to claim 5, wherein the metal comprises one of the group comprising copper, gold, and solder resist.

7. The circuit board element according to claim 1, wherein the walls of the at least one channel-shaped waveguide cavity are inclined.

8. The circuit board element according to claim 1, wherein the at least one integrated light-sensitive component is arranged on the dielectric layer comprising the at least one channel-shaped waveguide cavity, wherein the at least one channel-shaped waveguide cavity extends to reach underneath the at least one integrated light-sensitive component.

9. The circuit board element according to claim 1, wherein the layer comprising the at least one channel-shaped waveguide cavity is arranged on a heat dissipation layer.

10. The circuit board element according to claim 9, wherein the heat dissipation layer comprises aluminum.

11. The circuit board element according to claim 1, wherein the substrate is a heat dissipating material.

12. The circuit board element according to claim 11, wherein the substrate is made from aluminum.

13. The circuit board element according to claim 11, wherein the at least one integrated light-sensitive component is a photocell.

14. The circuit board element according to claim 1, wherein the at least one integrated light-sensitive component is a photodiode.

15. The circuit board element according to claim 1, wherein the at least one channel-shaped waveguide cavity is confined by a frame imprinted on the substrate.

16. A method for producing a circuit board element according to claim 1, wherein on a ready-processed substrate, a circuit board layer that has been pre-fabricated by forming an elongate cavity in a dielectric layer is applied, whereafter the optical material is applied in the cavity thereby forming the at least one channel-shaped waveguide.

17. The method according to claim 16, wherein the at least one channel-shaped waveguide cavity is filled with the optical material, by screen printing, spreading by doctor blade, or ink jet.

18. The method according to claim 16, wherein the upper side of the optical material is covered with a reflective layer.

19. The method according to claim 18, wherein the reflective layer is a solder resist.

20. The method according to claim 16, wherein the walls of the at least one channel-shaped waveguide cavity are coated with a metal.

21. The method according to claim 16, wherein the at least one integrated light-sensitive component is applied on the dielectric layer, partially covering the at least one channel-shaped waveguide cavity.

22. A method for producing a circuit board element according to claim 1, wherein a dielectric layer is arranged on the substrate, the dielectric layer comprising a channel-shaped cavity to which, the at least one channel-shaped waveguide is applied by laser structuring and removing of defined regions, or by imprinting by means of block print.

23. The method according to claim 22, wherein the at least one channel-shaped waveguide cavity is filled with the optical material by screen printing, spreading by doctor blade, or ink jet.

24. The method according to claim 22, wherein the upper side of the optical material is covered with a reflective layer.

25. A method for producing a circuit board element according to claim 1, wherein a frame of a dielectric surrounding the at least one channel-shaped waveguide cavity is imprinted on the substrate.

26. The method according to claim 25, wherein the at least one channel-shaped waveguide cavity is filled with the optical material by screen printing, spreading by doctor blade, or ink jet.

27. The method according to claim 25, wherein the upper side of the optical material is covered with a reflective layer.

28. The circuit board element according to claim 1, wherein the walls of the LED cavity are inclined.

29. The circuit board element according to claim 1, wherein the at least one channel-shaped waveguide cavity is confined by a frame imprinted on a dielectric layer.

\* \* \* \* \*